(12) United States Patent
Liberman et al.

(10) Patent No.: US 6,297,440 B1
(45) Date of Patent: Oct. 2, 2001

(54) THERMOELECTRIC DEVICE AND METHOD OF MAKING

(75) Inventors: Michael Liberman; Alexander Sobolevsky, both of Deland, FL (US)

(73) Assignee: USF Filtration and Separations Group, Inc., Timenium, MD (US)

( * ) Notice: Subject to any disclaimer, the term of this patent is extended or adjusted under 35 U.S.C. 154(b) by 0 days.

(21) Appl. No.: 09/411,076

(22) Filed: Oct. 4, 1999

Related U.S. Application Data

(63) Continuation-in-part of application No. 09/094,396, filed on Jun. 9, 1998, now Pat. No. 6,079,089.
(60) Provisional application No. 60/049,140, filed on Jun. 10, 1997, and provisional application No. 60/103,036, filed on Oct. 5, 1998.

(51) Int. Cl.$^7$ ..................................................... H01L 35/34
(52) U.S. Cl. ............................ 136/201; 136/203; 136/205
(58) Field of Search .................................. 136/201, 203, 136/205, 233

(56) References Cited

U.S. PATENT DOCUMENTS 6,079,089 * 6/2000 Quick et al. ........................ 29/25.42

* cited by examiner

*Primary Examiner*—Kathryn Gorgos
*Assistant Examiner*—Thomas H Parsons
(74) *Attorney, Agent, or Firm*—Frijouf, Rust & Pyle, P.A.

(57) ABSTRACT

An apparatus and process for making a thermoelectric device for generating an electrical voltage when elevated in temperature. The apparatus comprises an array of a multiplicity of thermoelectric elements with each of the thermoelectric elements comprising a first metal component surrounded by a second metal component with a dielectric material interposed therebetween. A first connector interconnects the first metal components to form a first thermoelectric terminal. A second connector interconnects the second metal components to form a second thermoelectric terminal. A junction connector forms a multiplicity of thermoelectric junctions between the first metal components and the second metal components.

30 Claims, 9 Drawing Sheets

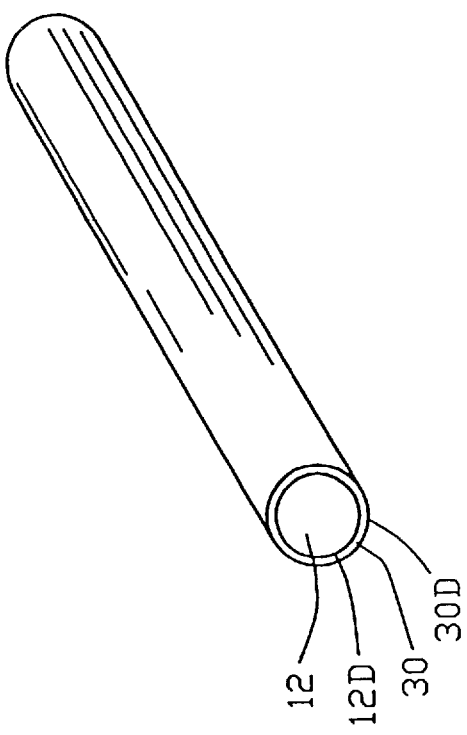
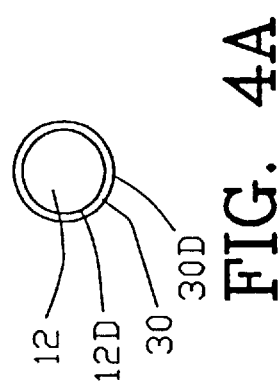
FIG. 4
FIG. 4A
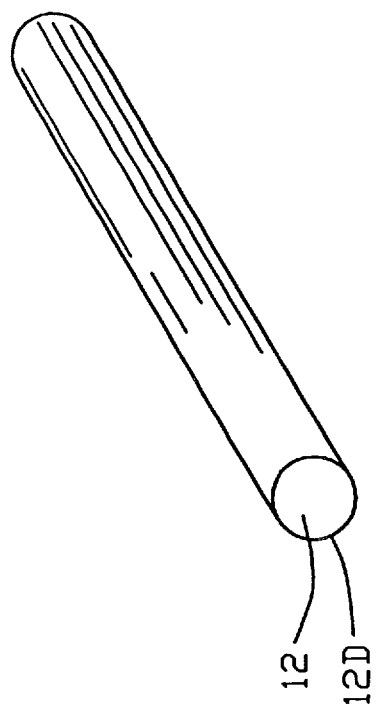
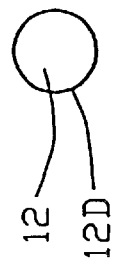
FIG. 3
FIG. 3A

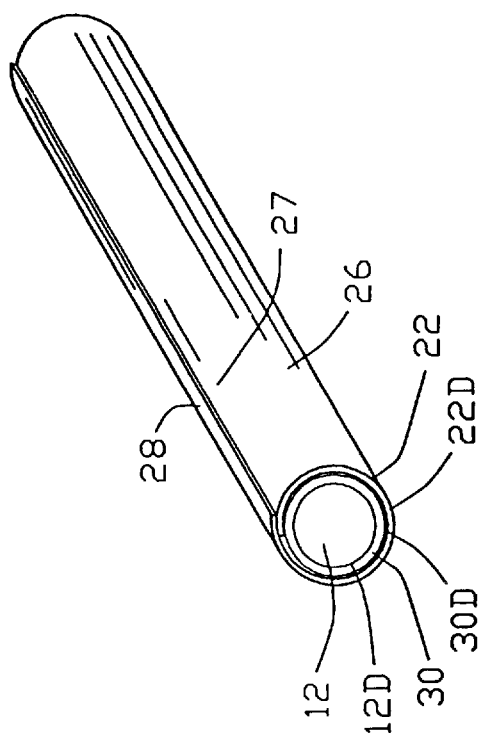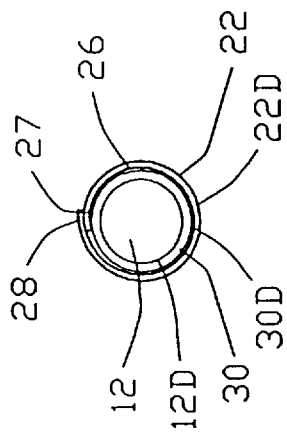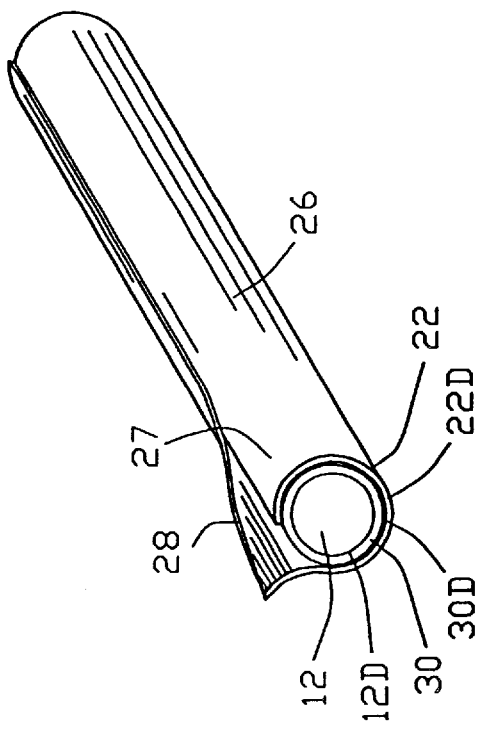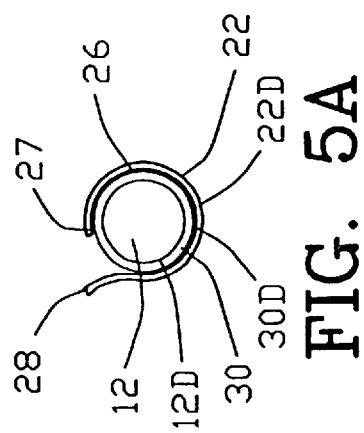
FIG. 5
FIG. 5A
FIG. 6
FIG. 6A

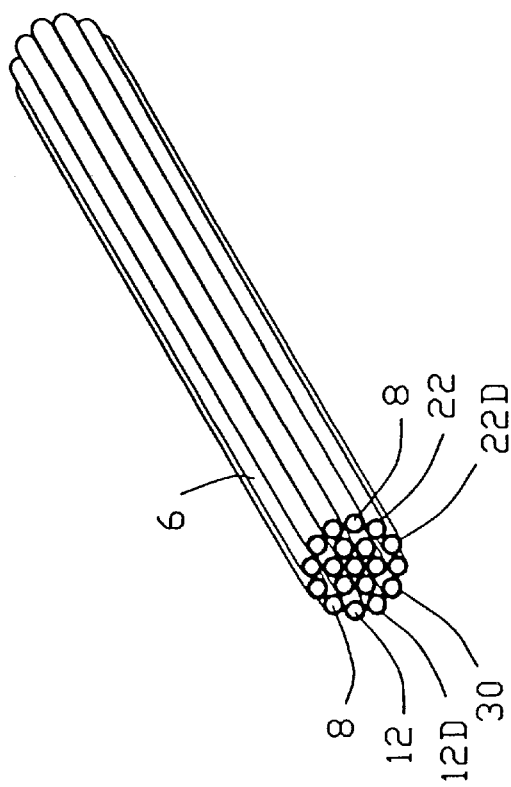
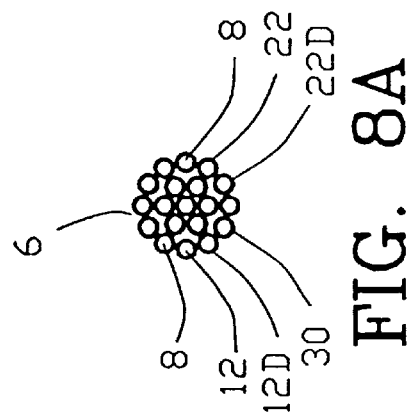
FIG. 8
FIG. 8A
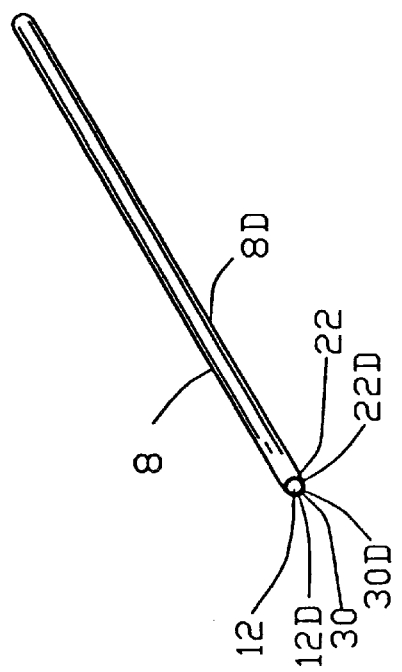
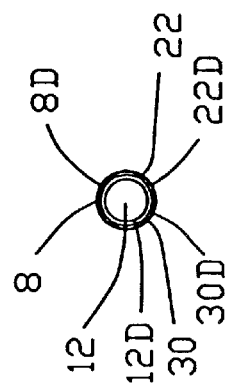
FIG. 7
FIG. 7A

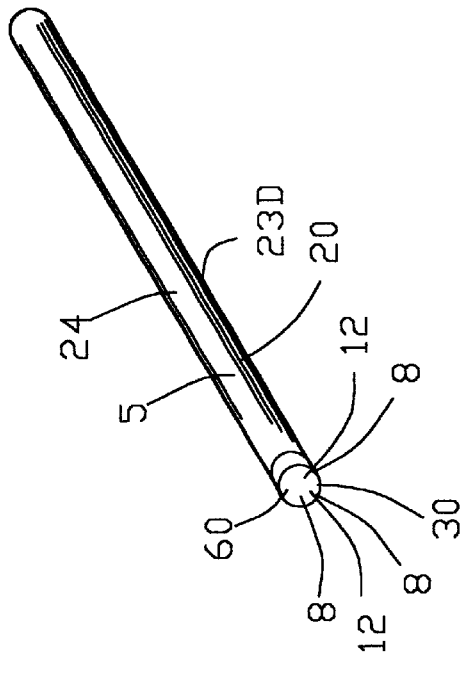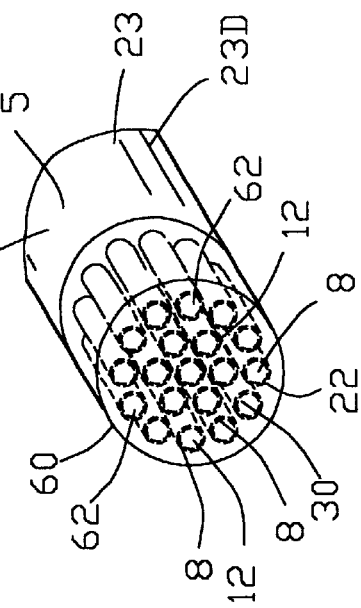
FIG. 12
FIG. 12A
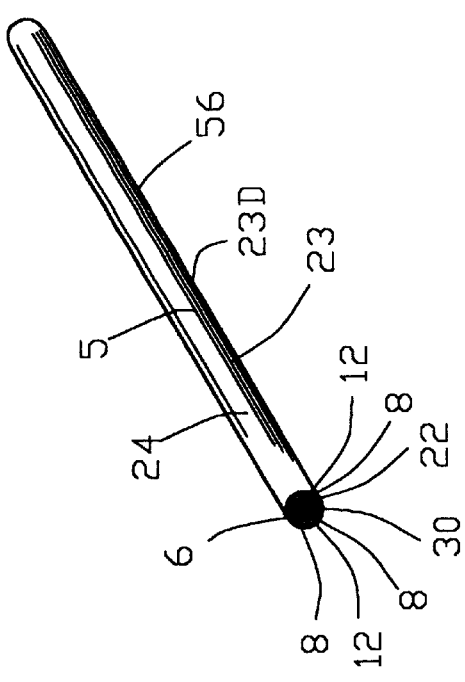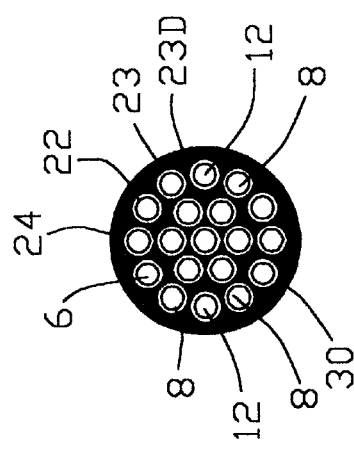
FIG. 11
FIG. 11A

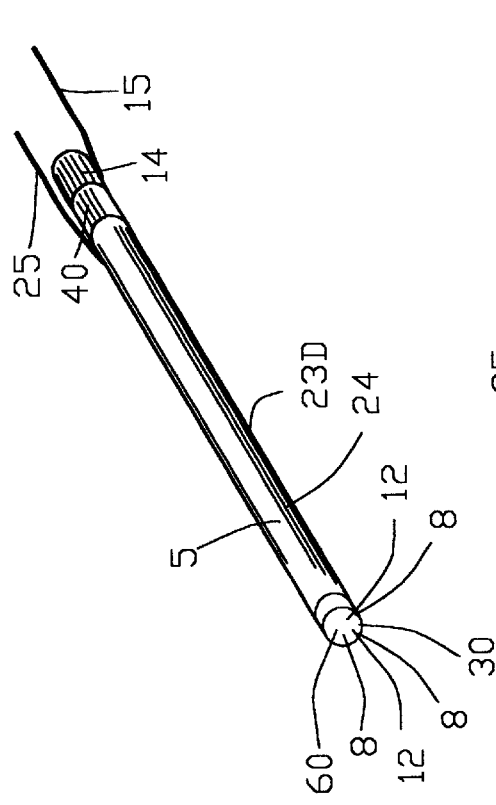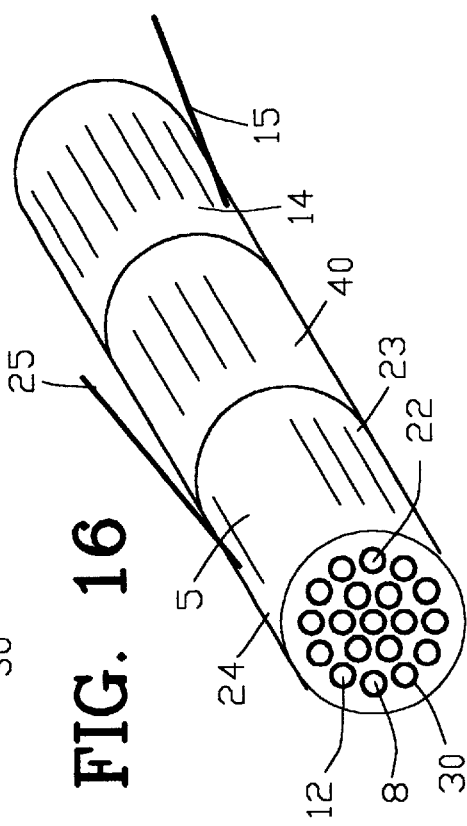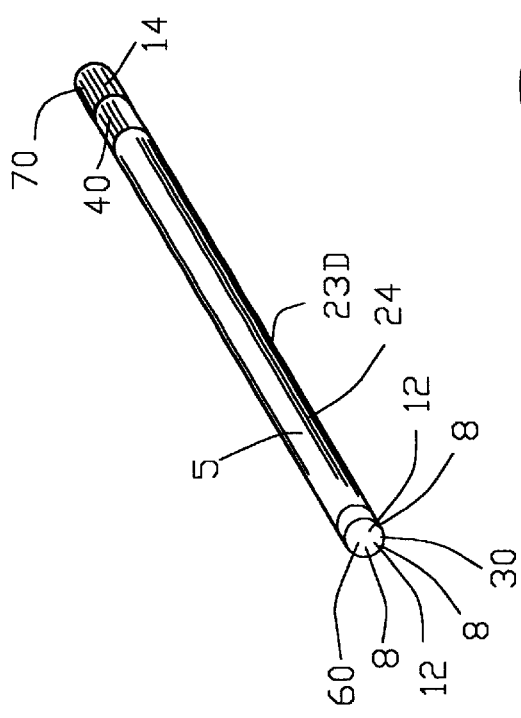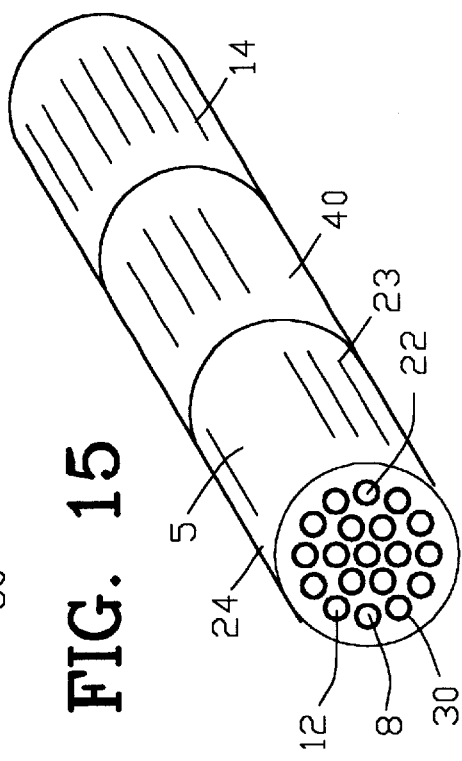

THERMOELECTRIC DEVICE AND METHOD OF MAKING

CROSS-REFERENCE TO RELATED APPLICATIONS

This application is a continuation-in-part of application No. 09/094,396 filed Jun. 9, 1998 (now U.S. Pat. No. 6,079,089), which claims benefit of U.S. provisional application No. 60/049,140 filed Jun. 10, 1997. This application further claims benefit of U.S. Provisional application No. 60/103,036 filed Oct. 5, 1998. All subject matter set forth in application serial number 60/103,036 is hereby incorporated by reference into the present application as if fully set forth herein.

BACKGROUND OF THE INVENTION

1. Field Of The Invention

This invention relates to thermoelectrics devices for electrical and electronic circuits, and more particularly to an improved metallic thermoelectric device having a high capacitance and low physical volume. This invention also relates to the method of making the improved metallic thermoelectric device through a wire drawing process.

2. Description of the Related Art

Various types of thermoelectric devices have been known to the prior art. One particular form of thermoelectric device is a metallic thermoelectric device formed by a junction of two dissimilar metallic materials. It is well known in the art that many junctions formed with two dissimilar metallic materials will generate a voltage and a current when the junction is elevated in temperature relative to an ambient temperature. The extent of voltage produced by the junction is determined by the types of metallic materials used for forming the junction and the differential in temperature of the junction relative to an ambient temperature.

Typically, the metallic junction thermoelectric devices were used as temperature sensors. These devices, commonly called thermocouples, were placed in a region for determining the temperature of the region. The voltage output of the thermocouple was measured by a voltmeter having a high impedance input. In these applications, the thermocouple functioned as a voltage generator.

In other applications, junctions of dissimilar metallic materials have been used to generate both a voltage and a current to provide an electrical power generator. Typically, a plurality of metallic junctions were connected in electrical parallel to produce a current of sufficient magnitude to provide the electrical power generation. The plurality of metallic junctions were placed in proximity to heat sources such as a geothermal heat source, a solar heat source or a nuclear heat source for generating electrical power.

Over the years, the size of electronic components has decreased steadily and dramatically in the electrical and electronic art. Along with such dramatic decreases in the size of electrical components, the speed and complexity of electronic components has increased substantially in the electrical and electronic art. The decrease in size of electronic components has been primarily within the areas of semiconductors and resistant elements. However, such dramatic decreases in size have not effected the area of thermoelectric devices.

Accordingly, it is an object of the present invention to provide an apparatus and method of making a thermoelectric device having an extremely high power output for a physical size which was heretofore unknown by the prior art.

Another object of this invention is to provide an apparatus and method of making a thermoelectric device which is extremely reliable and capable of high temperature operation.

Another object of this invention is to provide an apparatus and method of making a thermoelectric device which utilizes a plurality of coaxial thermoelectric devices connected in electrical parallel.

Another object of this invention is to provide an apparatus and method of making a thermoelectric device by drawing coaxial conductors separated by a dielectric material in a wire drawing process.

Another object of this invention is to provide an apparatus and method of making a thermoelectric device by drawing a multiplicity of individual coaxial thermoelectric devices in a wire drawing process.

The foregoing has outlined some of the more pertinent objects of the present invention. These objects should be construed as being merely illustrative of some of the more prominent features and applications of the invention. Many other beneficial results can be obtained by applying the disclosed invention in a different manner or modifying the invention within the scope of the invention. Accordingly, other objects in a full understanding of the invention may be had by referring to the summary of the invention, the detailed description describing the preferred embodiment in addition to the scope of the invention defined by the claims taken in conjunction with the accompanying drawings.

SUMMARY OF THE INVENTION

The present invention is defined by the appended claims with specific embodiments being shown in the attached drawings. For the purpose of summarizing the invention, the invention relates to an improved thermoelectric generator for generating an electrical voltage when elevated in temperature. The improved thermoelectric generator comprises an array of a multiplicity of thermoelectric elements. Each of the multiplicity of the thermoelectric elements comprises a first metal component surrounded by a second metal component with a dielectric material interposed therebetween. A first connector interconnects each of the first metal components of the multiplicity of the thermoelectric elements to form a first thermoelectric terminal. A second connector interconnects each of the second metal components of the multiplicity of the thermoelectric elements to form a second thermoelectric terminal. A junction connector interconnects each of the first metal components to the second metal components of the multiplicity of the thermoelectric elements to form a multiplicity of thermoelectric junctions thereby.

In one embodiment of the invention, each of the first metal components includes a metallic wire having a substantially circular cross-section. The dielectric material may include an oxide on each of the first metal components or may include a coating on each of the first metal components.

Preferably, each of the second metal components includes a metallic tube. Each of the second metal components may include a continuous metallic tube disposed about each of the first metal components and the dielectric materials. In the alternative, each of the second metal components may include a preformed metallic tube disposed about each of the first metal components and the dielectric materials.

In another embodiment of the invention, the first thermoelectric terminal includes each of the first metal components having an exposed portion. The first thermoelectric terminal interconnects each of the exposed portions of each of the multiplicity of the first metal components to form the first thermoelectric terminal. The second thermoelectric terminal includes the multiplicity of the thermoelectric elements being disposed within a metallic conduit and being in electrical contact therewith.

The junction thermoelectric connector includes a third metal component interconnecting each of the first metal components to the second metal components to form the thermoelectric junction thereby. The junction connector interconnects the first metal components to the second metal components to form a multiplicity of thermoelectric junctions interconnected in electrical parallel. Preferably, the third metal component is the same metal as only one of the first and second metal components. A terminal insulator insulates the first thermoelectric terminal from the second thermoelectric terminal.

The invention is also incorporated into the process for making a thermoelectric device comprising the steps of providing a first metal component and covering the first metal component with a dielectric material. The first metal component and the dielectric material are encased with a second metal component. The second metal component with the first metal component and the dielectric material therein is drawn for reducing the outer diameter thereof and for forming a thermoelectric element. A multiplicity of the thermoelectric elements are inserted within a metal conduit. The metal conduit with the multiplicity of the thermoelectric elements therein is drawn for reducing the outer diameter thereof and for electrically interconnecting the second metal components of the multiplicity of thermoelectric elements to form a second thermoelectric terminal. The first metal components of the multiplicity of thermoelectric elements are interconnected to form a first thermoelectric terminal. The multiplicity of the first metal components are interconnected to the multiplicity of the second metal components are interconnected with a junction connector to form a multiplicity of thermoelectric junctions thereby.

The foregoing has outlined rather broadly the more pertinent and important features of the present invention in order that the detailed description that follows may be better understood so that the present contribution to the art can be more fully appreciated. Additional features of the invention will be described hereinafter which form the subject of the claims of the invention. It should be appreciated that the conception and the specific embodiments disclosed may be readily utilized as a basis for modifying or designing other structures for carrying out the same purposes of the present invention. It also should be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which:

FIG. 3 is an isometric view of a first metal component referred to in FIG. 2;

FIG. 3A is an end view of FIG. 3;

FIG. 4 is an isometric view of a dielectric material encasing the first metal component of FIG. 3;

FIG. 4A is an end view of FIG. 4;

FIG. 5 is an isometric view of a second metal component initially encasing the first metal component and the dielectric material;

FIG. 5A is an end view of FIG. 5;

FIG. 6 is an isometric view of the second metal component completely encasing the first metal component and the dielectric material;

FIG. 6A is an end view of FIG. 6;

FIG. 7 is an isometric view after drawing the second metal component with the first metal component and the dielectric material to form a thermoelectric element;

FIG. 7A is an enlarged end view of FIG. 7;

FIG. 8 is an isometric view of assembling a multiplicity of the thermoelectric elements into an array;

FIG. 8A is an end view of FIG. 8;

FIG. 11 is an isometric view after drawing the metal conduit with the array of thermoelectric elements therein for electrically interconnecting the second metal component to form a second thermoelectric device;

FIG. 11A is an enlarged end view of FIG. 11;

FIG. 12 is an isometric view illustrating a junction connector forming a multiplicity of thermoelectric junctions;

FIG. 12A is an enlarged view of an end FIG. 12;

FIG. 15 is an isometric view of a first terminal interconnecting the multiplicity of the first metal components;

FIG. 15A is an enlarged view of FIG. 15;

FIG. 16 is an isometric view after attaching leads to the thermoelectric device of FIG. 15; and FIG. 16A is an enlarged view of FIG. 16.

Similar reference characters refer to similar parts throughout the several Figures of the drawings.

DETAILED DESCRIPTION OF THE INVENTION

Figure 1:
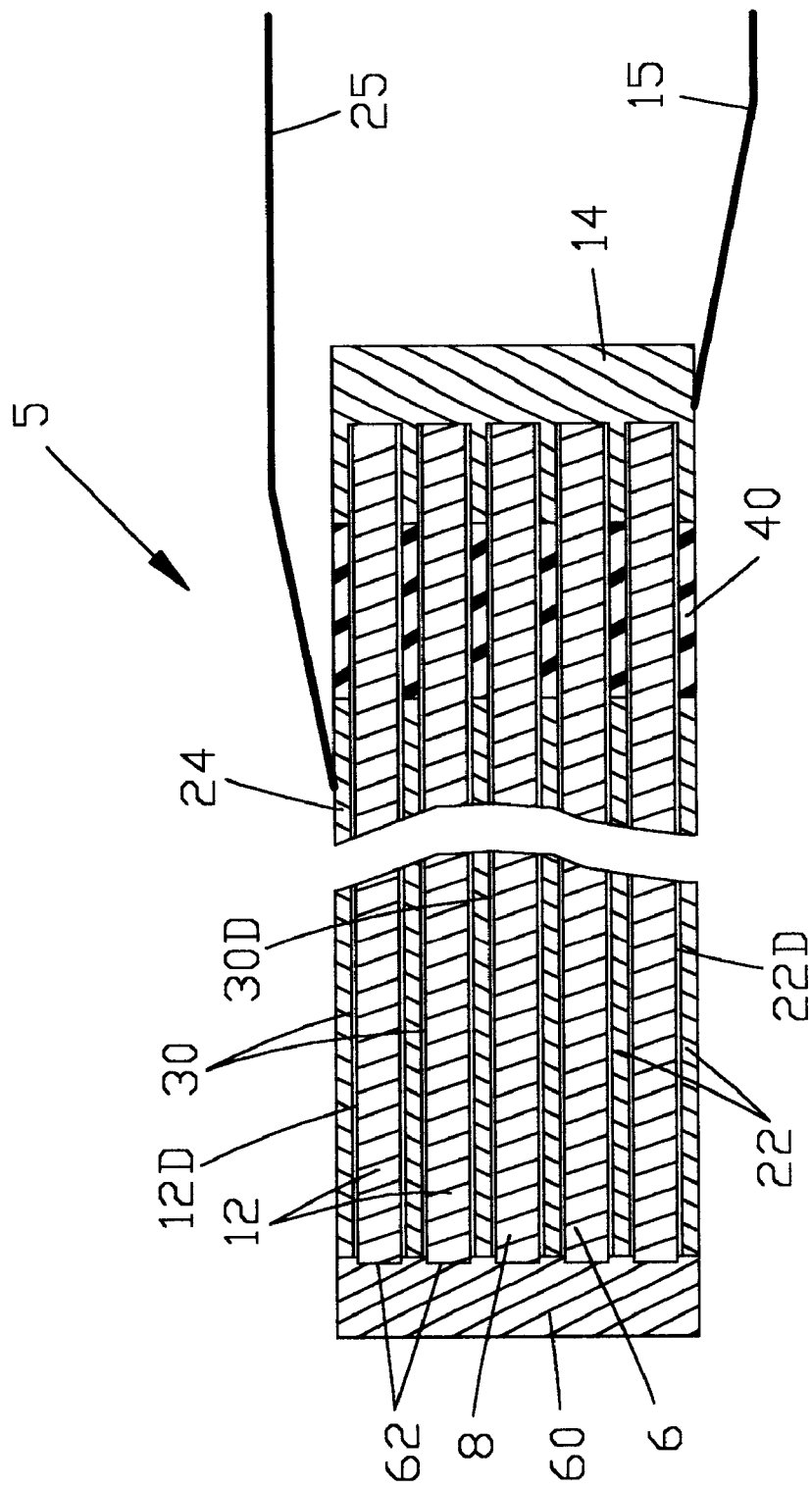
FIG. 1 is a sectional view of a thermoelectric device of the present invention.

FIG. 1 is a side sectional view of a thermoelectric device 5 of the present invention. The thermoelectric 5 comprises an array 6 of coaxial thermoelectric device elements 8 shown as a parallel array interconnected in electrical parallel.

The thermoelectric device 5 comprises a first metal component 12 and a second metal component 22 separated by a dielectric 30. The first metal component 12 comprises a multiplicity of first metal components 12 with each of the multiplicity of first metal components 12 being shown as a wire having an outer diameter 12D.

The second metal component 22 comprises a multiplicity of second metal components 22 with each of the multiplicity of second metal components 22 being shown encompassing the multiplicity of first metal components 12. A multiplicity of dielectric materials 30 are interposed between each of the multiplicity of first metal components 12 and the multiplicity of second metal components 22. Each of the second metal components 22 defines an outer diameter 22D whereas each of the multiplicity of dielectric materials 30 defines an outer diameter 30D.

The multiplicity of the first metal components 12 are connected by a first terminal 14. The first terminal 14 interconnects the multiplicity of first metal components 12 in electrical parallel. The first terminal 14 is connected to a first wire lead 15.

The multiplicity of second metal components 22 are connected by a second terminal 24. The second terminal 24 interconnects the multiplicity of second metal components 22 in electrical parallel. The second terminal 24 is connected to a second wire lead 25. A terminal insulator 40 is disposed between the first and second terminals 14 and 24. The terminal insulator 40 may be a unitary insulation applied by a potting process or the like.

The thermoelectric 5 has been shown with only a small number of coaxial thermoelectric device elements 8 within the array 6 for the sake of clarity. Preferably, 500 to 1000 coaxial thermoelectric elements 8 are contained within the array 6 when the thermoelectric device 5 is constructed in accordance with the process of the present invention. A junction connector 60 forms a multiplicity of thermoelectric junctions 62 between the multiplicity of first and second metal components 12 and 22.

Figure 2:
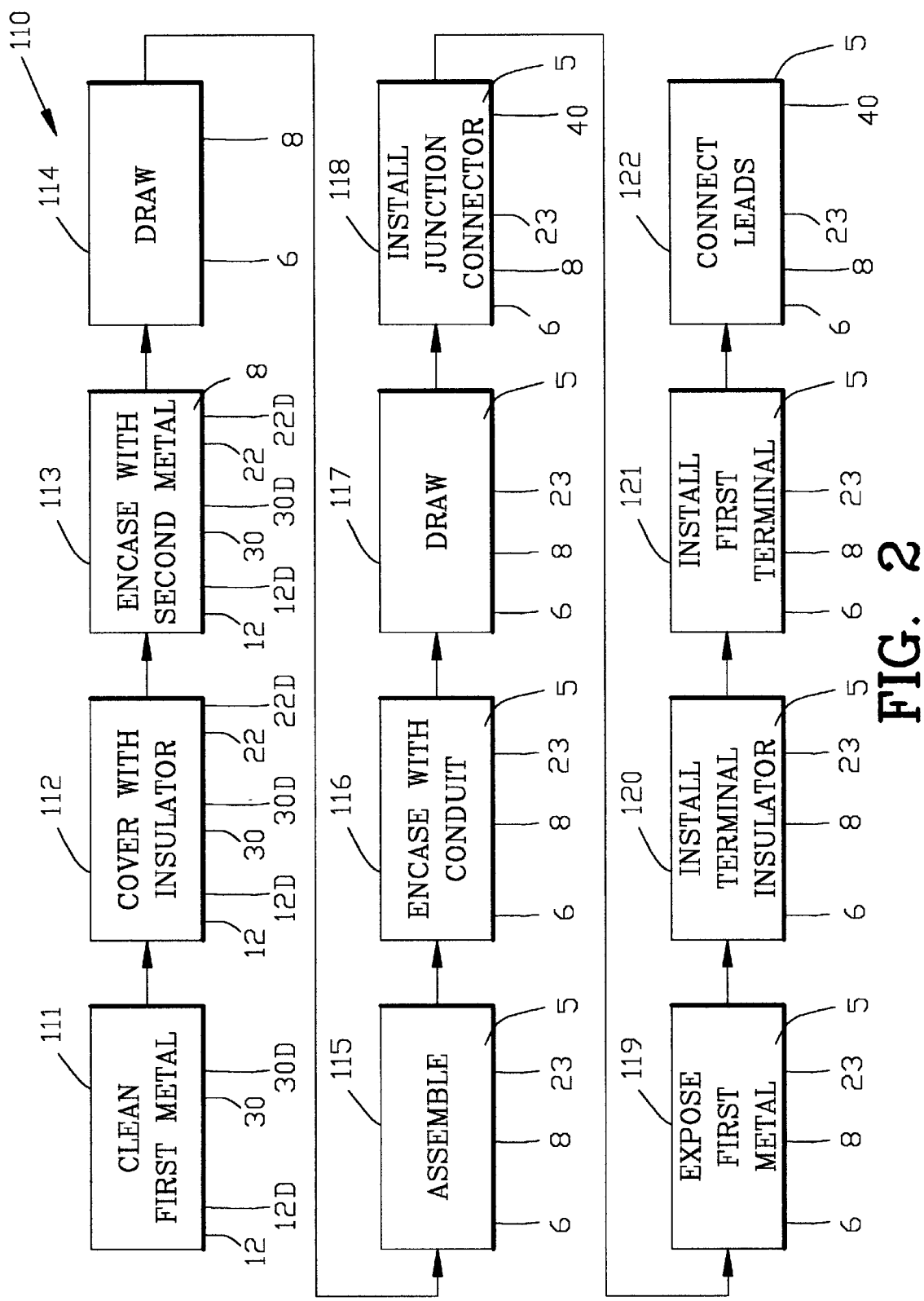
FIG. 2 is a block diagram illustrating an improved method of making the thermoelectric devices.

FIG. 2 is a block diagram illustrating a process 110 for making the thermoelectric device 5. The improved process 110 of FIG. 2 comprises process step 111 of cleaning of the first metal component 12. Preferably, the first metal component 12 is cleaned by conventional means for enabling the adhesion of the dielectric material 30.

FIG. 3 is an isometric view of the first metal component 12 referred to in FIG. 2 with FIG. 3A being an end view of FIG. 3. Preferably, the first metal component 12 is in the form of a metallic wire having a substantially circular cross-section defined by the outer diameter 12D.

FIG. 2 illustrates the process step 112 of covering the first metal component 12 with the dielectric material 30.

FIG. 4 is an isometric view of the dielectric material 30 encasing the first metal component 12 of FIG. 3 with FIG. 4A being an end view of FIG. 4. In one example of the invention, the dielectric material 30 is applied to the first metal component 12 to a thickness of 0.005 cm to 0.05 cm to define an outer diameter 30D. Preferably, the dielectric material 30 is an insulating material having a dielectric strength ranging from 40 to 400 volts/mill and a dielectric constant ranging from 2 to 12,000.

The process of covering the first metal component 12 with the dielectric material 30 may be accomplished in various ways depending upon the desired physical and electrical characteristics of the thermoelectric device 5. In one example of the invention, the process of covering the first metal component 12 with the dielectric material 30 includes forming an oxide on the first metal component 12. In another example of the invention, the process of covering the first metal component 12 with the dielectric material 30 includes coating the first metal component 12 with a dielectric material 30. The first metal component 12 may be coated with a flowable dielectric material 30 that cures onto the first metal component 12. In the alternative, the process of covering the first metal component 12 with the dielectric material 30 includes wrapping the first metal component 12 with a dielectric material 30 in the form of a dielectric cloth.

FIG. 2 illustrates the process step 113 of encasing the first metal component 12 with the dielectric material 30 thereon with the second metal component 22.

FIG. 5 is an isometric view of the second metal component 22 initially encasing the first metal component 12 and the dielectric material 30 with FIG. 5A being an end view of FIG. 5. The second metal component 22 is defined by a longitudinally extending sheet 26 having a first and a second edge 27 and 28. The first metal component 12 with the dielectric material 30 thereon is encased by bending the first and second edges 27 and 28 of the longitudinally extending sheet 26 of the second metal component 22 about the first metal component 12 and the dielectric material 30.

FIG. 6 is an isometric view of the second metal component 22 completely encasing the first metal component 12 and the dielectric material 30 with FIG. 6A being an end view of FIG. 6. The second edge 28 of the second metal component 22 overlaps the first edge 27 of the second metal component 22. The second metal component 22 encircles the first metal component 12 and the dielectric material 30 to have a substantially circular cross-section defined by an outer diameter 22D. Preferably, the second metal component 22 is in the form of a continuous metal tube having different chemical properties than the first metal component 12.

FIG. 2 illustrates the process step 114 of drawing the second metal component 22 with first metal component 12 and the dielectric material 30 therein for reducing the outer diameter 22D thereof and for forming the coaxial thermoelectric element 8.

FIG. 7 is an isometric view after drawing the second metal component 22 with the first metal component 12 and the dielectric material 30 to form the thermoelectric element 8. FIG. 7A is an enlarged end view of FIG. 7. The drawing of the second metal component 22 moves the first metal component 12 and the second metal component 22 into engagement with opposed sides of the dielectric material 30 to form the thermoelectric element 8 thereby.

FIG. 2 illustrates the process step 115 of assembling the array 6 of a multiplicity of thermoelectric elements 8 in a substantially parallel configuration.

FIG. 8 is an isometric view of a multiplicity of the thermoelectric elements 8 assembled into the array 6 with FIG. 8A being an end view of FIG. 8. Preferably, 500 to 1000 thermoelectric elements 8 are arranged in a substantially parallel configuration to form the array 6.

FIG. 2 illustrates the process step 116 of encasing the array 6 of the multiplicity of thermoelectric elements 8 within the metal conduit 23.

Figure 9:
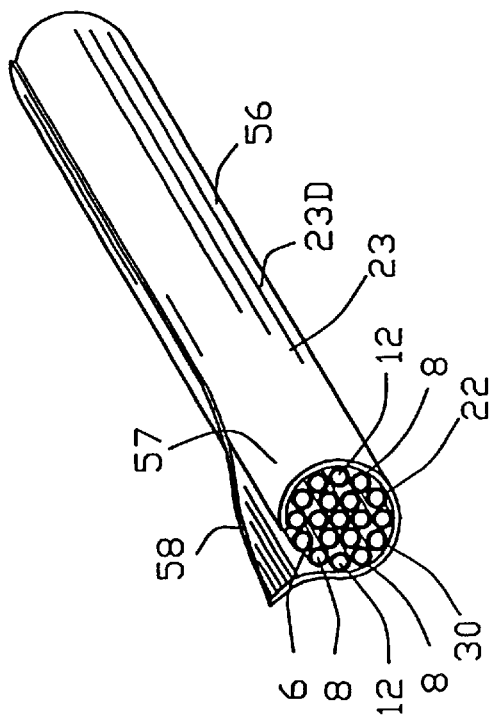
FIG. 9 is an isometric view of a metal conduit initially encasing the array of thermoelectric elements.
Figure 9A:
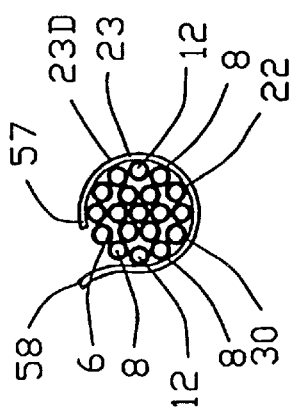
FIG. 9A is an end view of FIG. 9.

FIG. 9 is an isometric view of the metal conduit 23 initially encasing the array 6 of thermoelectric elements 8 with FIG. 9A being an end view of FIG. 9. Preferably, the metal conduit 23 is in the form of a continuous metal tube having the same chemical properties as the second metal component 22.

The metal conduit 23 is defined by a longitudinally extending sheet 56 having a first and a second edge 57 and 58. The array 6 of the multiplicity of the thermoelectric elements 8 are encased by bending the first and second edges 57 and 58 of the longitudinally extending metallic sheet 56 about the array 6 of the multiplicity of the thermoelectric elements 8.

Figure 10:
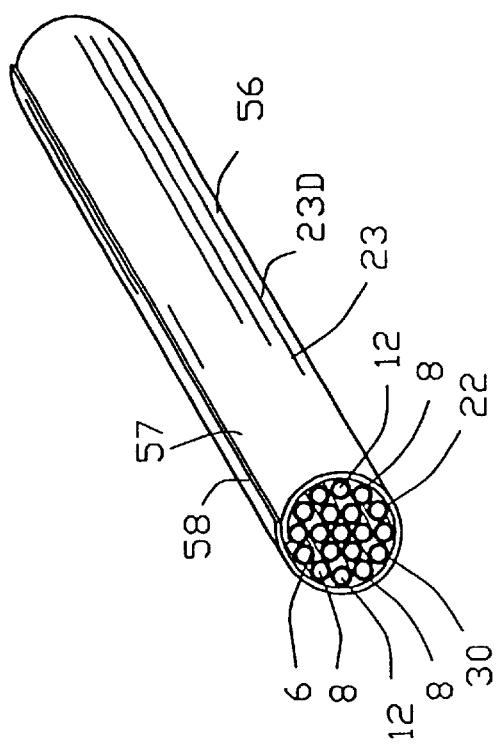
FIG. 10 is an isometric view of the metal conduit completely encasing the array of thermoelectric elements.
Figure 10A:
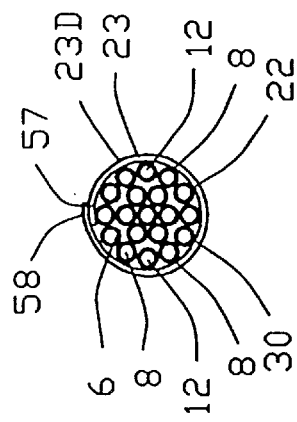
FIG. 10A is an end view of FIG. 10.

FIG. 10 is an isometric view of the metal conduit 23 completely encasing the array 6 of the thermoelectric elements 8 with FIG. 10A being an enlarged end view of FIG. 10. The second edge 58 of the metal conduit 23 overlaps the first edge 57 of the metal conduit 23. The metal conduit 23 encircles the array 6 to have a substantially circular cross-section defined by an outer diameter 23D.

In the alternative, the step of inserting the array 6 of the multiplicity of the thermoelectric elements 8 within the metal conduit 23 may include simultaneously inserting the array 6 of the multiplicity of the thermoelectric elements 8 within a preformed metal conduit (not shown).

FIG. 2 illustrates the process step 117 of drawing the metal conduit 23 with the array 6 of thermoelectric elements 8 therein.

FIG. 11 is an isometric view after drawing the metal conduit 23 with the array 6 of thermoelectric elements 8 therein for electrically interconnecting the second metal component 22 with the metal conduit 23. FIG. 11A is an enlarged end view of FIG. 11. The drawing of the metal conduit 23 with the array 6 of the multiplicity of the thermoelectric elements 8 therein reduces the outer diameter 23D of the metal conduit 23 and electrically interconnects the multiplicity of the second metal component 22 with the metal conduit 23.

The process step 117 of drawing the metal conduit 23 with the array 6 of thermoelectric elements 8 therein provides three effects. Firstly, the process step 117 reduces an outer diameter 23D of the metal conduit 23. Secondly, the process step 117 reduces the corresponding outer diameter 8D of each of the thermoelectric elements 8 and the corresponding thickness of the dielectric material 30. Thirdly, the process step 117 causes the second metal component 22 to diffusion weld with adjacent second metal component 22 and to diffusion weld with the metal conduit 23 and to form the second terminal 24.

The diffusion welding of the second metal component 22 to adjacent second metal component 22 and with the metal conduit 23 forms the unitary second terminal 24. The multiplicity of the first metal component 12 surrounded by the dielectric material 30 are contained within the unitary second terminal 24.

FIG. 2 illustrates the process step 118 of interconnecting each of the first metal components 12 to the second metal components 22 of the multiplicity of the thermoelectric elements 8.

FIG. 12 is an isometric view illustrating the junction connector 60. FIG. 12A is an enlarged end view of FIG. 12. The junction connector 60 forms a multiplicity of thermoelectric junctions 62 thereby. The junction connector 60 includes a third metal component interconnect each of the first metal components 12 to the second metal components 22. The third metal component is the same metal as one of the first and second metal components 12 and 22. Preferably, the junction connector 60 comprises a third metal component being the same material as the second metal component 22 for interconnecting all of the first metal components 12 to the second metal component 22. The junction connector 60 interconnects the first metal components 12 to the second metal components 22 to form a multiplicity of thermoelectric junctions 62 interconnected in electrical parallel.

FIG. 2 illustrates the process step 119 of exposing a portion 70 of each of the first metal components 12 of the multiplicity of the thermoelectric elements 8.

Figure 13:
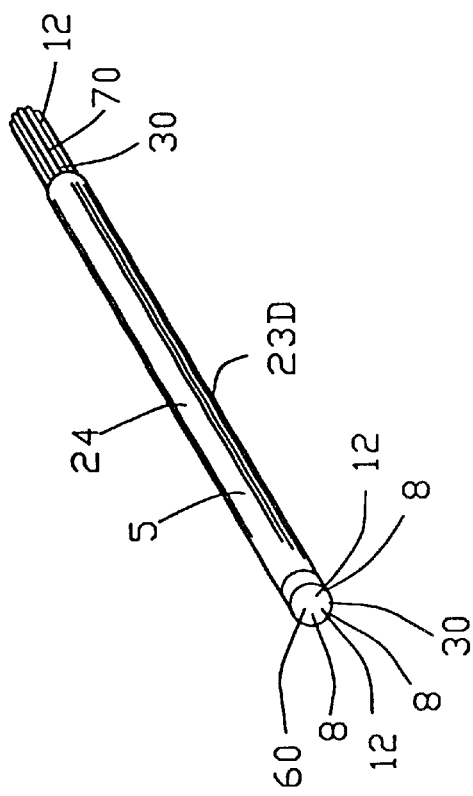
FIG. 13 is an isometric view after exposing a portion of each of the first metal components of the array of thermoelectric elements.
Figure 13A:
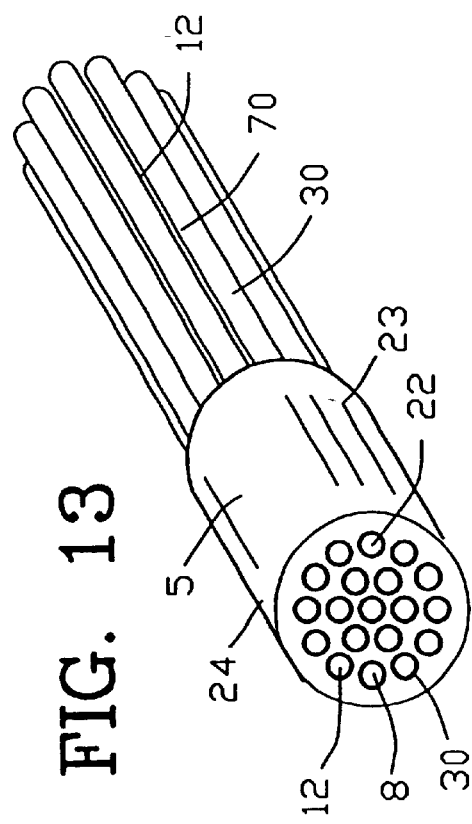
FIG. 13A is an enlarged cut away view of an end of FIG. 13.

FIG. 13 is an isometric view after exposing the portion 70 of each of the first metal components 12 of the array 6 of thermoelectric elements 8. FIG. 13A is an enlarged cut away end view of FIG. 13. In one process of the present invention, the process of exposing the portion 70 of each of the first metal components 12 of the array 6 of thermoelectric elements 8 includes chemically removing a portion of the second metal component 22 and a portion of the metal conduit 23 and the second terminal 24.

Since the second metal components 22 and the metal conduit 23 have different chemical properties than the first metal component 12, a portion of the second metal component 22 and a portion of the metal conduit 23 may be chemically removed without removal of the first metal component 12. In one example of the invention, a portion of the second metal component 22 and a portion of the metal conduit 23 may be chemically removed by immersion into an acid for dissolving a portion of the second metal component 22 and a portion of the metal conduit 23.

FIG. 2 illustrates the process step 120 of installing a terminal insulator 40 shown in FIG. 1 for insulating the first terminal 14 from the second terminal 24.

Figure 14:
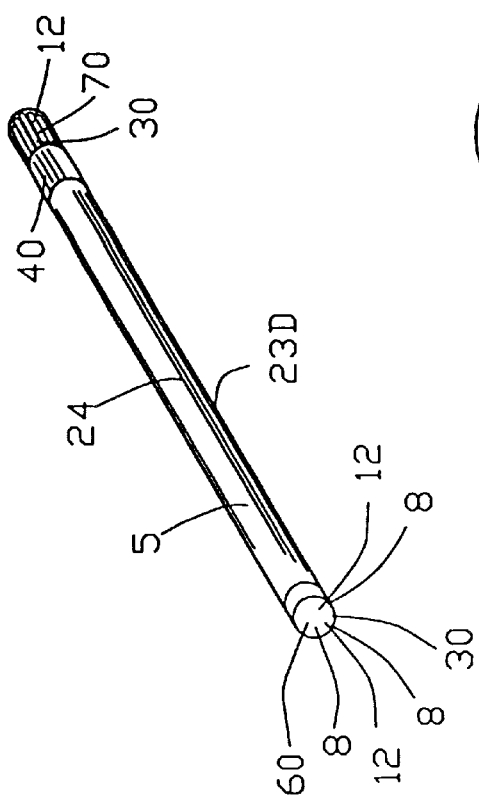
FIG. 14 is an isometric view illustrating the installation of a terminal insulator.
Figure 14A:
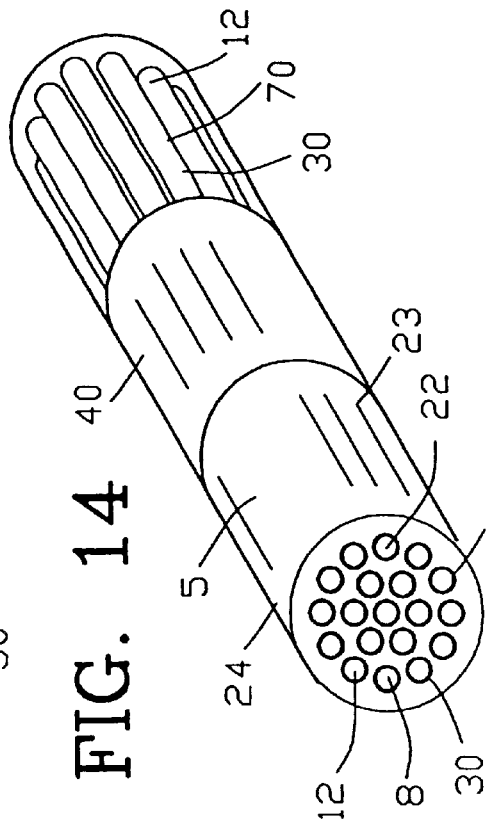
FIG. 14A is an enlarged cut away of an end FIG. 14.

FIG. 14 is an isometric view illustrating the installation of the terminal insulator 40 with FIG. 14A being an enlarged cut away view of an end of FIG. 14. The terminal insulator 40 may be of various types of insulators including encapsulating the first metal component 12 and the overlying dielectric material 30 with the terminal insulator 40. In the alternative, the insulating covering 40 may be a unitary insulation applied by a potting process or the like.

FIG. 2 illustrates the process step 121 of installing a first terminal 14 for interconnecting the multiplicity of the first metal components 12.

FIG. 15 is an isometric view of the first terminal 14 interconnecting the multiplicity of the first metal components 12. FIG. 15A is an enlarged cut away view an end of FIG. 15. In one example of the present invention, the exposed portions 70 of each of the multiplicity of the first metal component 12 are interconnected with the first terminal 14 by a soldering process. In the alternative, the exposed portions 70 of each of the multiplicity of the first metal component 12 is interconnected with the first terminal 14 by a welding process. It should be appreciated by those skilled in the art that various ways may be utilized to electrically interconnect the multiplicity of the first metal component 12.

FIG. 2 illustrates the process step 122 of installing the first and second leads 15 and 25 to the first and second terminals 14 and 24 shown in FIG. 1.

FIG. 16 is an isometric view of the first and second leads 15 and 25 connected to the first and second terminals 14 and 24. FIG. 16A is an enlarged cut away view an end of FIG. 16. The leads 15 and 25 may be conventional electrical connectors secured to the first and second terminals 14 and 24 by appropriate means.

The present invention contemplates a thermoelectric device to include power generators, microcoolers, thermocouples and related sensors. It is believed the apparatus and process of the present invention can be used to fabricate thermoelectric devices from novel thermoelectric materials including intermetallics, silicides (metal-silicon alloys), bismuth antimony alloys, skutterudite alloys and some chalcogenides.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. An improved thermoelectric device for generating an electrical voltage when elevated in temperature, comprising:

an array of a multiplicity of thermoelectric elements;

each of said multiplicity of said thermoelectric elements comprising a first metal component surrounded by a second metal component with a dielectric material interposed therebetween;

a first connector interconnecting each of said first metal components of said multiplicity of said thermoelectric elements to form a first thermoelectric terminal;

a second connector interconnecting each of said second metal components of said multiplicity of said thermoelectric elements to form a second thermoelectric terminal; and a junction connector interconnecting each of said first metal components to said second metal components of said multiplicity of said thermoelectric elements to form a multiplicity of thermoelectric junctions thereby.

2. An improved thermoelectric device as set forth in claim 1, wherein each of said first metal components includes a metallic wire.

3. An improved thermoelectric device as set forth in claim 1, wherein each of said first metal components includes a metallic wire having a substantially circular cross-section.

4. An improved thermoelectric device as set forth in claim 1, wherein said dielectric material includes an oxide on each of said first metal components.

5. An improved thermoelectric device as set forth in claim 1, wherein said dielectric material includes a coating on each of said first metal components.

6. An improved thermoelectric device as set forth in claim 1, wherein each of said second metal components includes a metallic tube.

7. An improved thermoelectric device as set forth in claim 1, wherein each of said second metal components includes a continuous metallic tube disposed about each of said first metal components and said dielectric materials.

8. An improved thermoelectric device as set forth in claim 1, wherein said first thermoelectric terminal includes each of said first metal components having an exposed portion; and said first thermoelectric terminal interconnecting each of said exposed portions of each of said multiplicity of said first metal components to form said first thermoelectric terminal.

9. An improved thermoelectric device as set forth in claim 1, wherein said second thermoelectric terminal includes said multiplicity of said thermoelectric elements being disposed within a metallic conduit and being in electrical contact therewith.

10. An improved thermoelectric device as set forth in claim 1, wherein said junction thermoelectric connector includes a third metal component interconnecting each of said first metal components to said second metal components to form said thermoelectric junction thereby.

11. An improved thermoelectric device as set forth in claim 1, wherein said junction thermoelectric connector includes a third metal component being the same metal as only one of said first and second metal components.

12. An improved thermoelectric device as set forth in claim 1, including a terminal insulator for insulating said first thermoelectric terminal from said second thermoelectric terminal.

13. An improved thermoelectric device as set forth in claim 1, wherein said second connector interconnects all of said second metal components; and said junction connector comprising a third metal component being the same material as said second metal component for interconnecting all of said first metal components to said second connector.

14. An improved thermoelectric device as set forth in claim 1, wherein said junction connector interconnects said first metal components to said second metal components to form a multiplicity of thermoelectric junctions interconnected in electrical parallel.

15. A process for making a thermoelectric device, comprising the steps of:

providing a first metal component;

covering the first metal component with a dielectric material;

encasing the first metal component and the dielectric material with a second metal component;

drawing the second metal component with the first metal component and the dielectric material therein for reducing the outer diameter thereof and for forming a thermoelectric element;

inserting a multiplicity of the thermoelectric elements within a metal conduit;

drawing the metal conduit with the multiplicity of the thermoelectric elements therein for reducing the outer diameter thereof and for electrically interconnecting the second metal components of the multiplicity of thermoelectric elements to form a second thermoelectric terminal;

interconnecting the first metal components of the multiplicity of thermoelectric elements to form a first thermoelectric terminal; and interconnecting the multiplicity of the first metal components to the multiplicity of the second metal components with a junction connector to form a multiplicity of thermoelectric junctions thereby.

16. A process for making a thermoelectric device as set forth in claim 15, wherein the step of providing a first metal component includes providing a first metal component in the form of a metallic wire.

17. A process for making a thermoelectric device as set forth in claim 15, wherein the step of providing a first metal component includes providing a first metal component in the form of a metallic wire having a substantially circular cross-section.

18. A process for making a thermoelectric device as set forth in claim 15, wherein the step of covering the first metal component with a dielectric material includes forming an oxide on the first metal component.

19. A process for making a thermoelectric device as set forth in claim 15, wherein the step of covering the first metal component with a dielectric material includes coating the first metal component with a dielectric material.

20. A process for making a thermoelectric device as set forth in claim 15, wherein the step of covering the first metal component with a dielectric material includes wrapping the first metal component with a dielectric material in the form of a dielectric cloth.

21. A process for making a thermoelectric device as set forth in claim 15, wherein the step of covering the first metal component with a dielectric material includes covering the first metal component in the form of a metallic wire having a diameter of 0.01 cm to 0.2 cm with the dielectric material having a thickness of 0.005 cm–0.05 cm.

22. A process for making a thermoelectric device as set forth in claim 15, wherein the step of encasing the first metal component and the dielectric material with a second metal component includes forming a continuous metal tube about the first metal component and the dielectric material.

23. A process for making a thermoelectric device as set forth in claim 15, wherein the step of encasing the first metal component and the dielectric material with a second metal component includes encasing the first metal component and the dielectric material within a preformed metal tube.

24. A process for making a thermoelectric device as set forth in claim 15, wherein the step of encasing the first metal component and the dielectric material with a second metal component includes encasing the first metal component and the dielectric material within a metal tube having different chemical properties than the chemical properties of the first metal component.

25. A process for making a thermoelectric device as set forth in claim 15, wherein the step of inserting a multiplicity of the thermoelectric elements within the metal conduit includes forming a parallel array of the multiplicity of the thermoelectric elements; and inserting the parallel array of the multiplicity of the thermoelectric elements within a preformed metallic conduit.

26. A process for making a thermoelectric device as set forth in claim 15, wherein the step of inserting a multiplicity of the thermoelectric elements within the metal conduit includes forming a continuous metal conduit about the multiplicity of the thermoelectric elements.

27. A process for making a thermoelectric device as set forth in claim 15, wherein the step of encasing the first metal components and the dielectric material with a second metal component include forming an array of a multiplicity of first metal components and the dielectric materials; and simultaneously inserting the array of the multiplicity of the first metal components and the dielectric materials within a preformed metal tube.

28. A process for making a thermoelectric device as set forth in claim 15, wherein the step of drawing the metal conduit for electrically interconnecting the multiplicity of the second metal components includes drawing the metal conduit for diffusion welding the second metal components to the metal conduit to form a substantially unitary material.

29. A process for making a thermoelectric device as set forth in claim 15, wherein the step of interconnecting the multiplicity of the first metal components with the first thermoelectric terminal includes exposing a portion of each of the first metal components of the array of thermoelectric elements; and interconnecting the exposed portion of each of the multiplicity of the first metal components with the first thermoelectric terminal.

30. A process for making a thermoelectric device as set forth in claim 15, wherein the step of interconnecting the multiplicity of the first metal components with the first thermoelectric terminal includes exposing a portion of each of the first metal components of the array of thermoelectric elements by chemically removing a portion of each of the second metal components and a portion of each of the second thermoelectric terminal; and interconnecting the exposed portion of each of the multiplicity of the first metal components with the first thermoelectric terminal.

\* \* \* \* \*